Oct. 12, 1965 M. R. LIPPS 3,210,829

METHOD OF MAKING A SWITCH STATOR

Filed Nov. 2, 1964

INVENTOR.
MILTON R. LIPPS
BY Alden D. Redfield
Charles M. Hogan
ATTORNEYS.

3,210,829
METHOD OF MAKING A SWITCH STATOR

Milton R. Lipps, Cincinnati, Ohio, assignor to Avco Corporation, Cincinnati, Ohio, a corporation of Delaware Filed Nov. 2, 1964, Ser. No. 408,065
1 Claim. (Cl. 29—155.5)

The present invention relates to encapsulated circuitry, and, specifically, it provides a novel module or package servng as a stator for a switch and including switch contacts.

The primary object of the invention is to provide a composite switch and circuit board in which the contacts are flush with the surface.

Another object of the invention is to provide a process for integrating flush circuit contacts into a multilayered circuit package.

This invention provides a novel package of integrated circuitry wherein circuit selections may be made directly for tuning and similar purposes.

Figure 1:
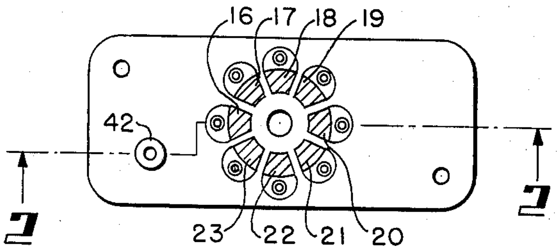
Figure 2:
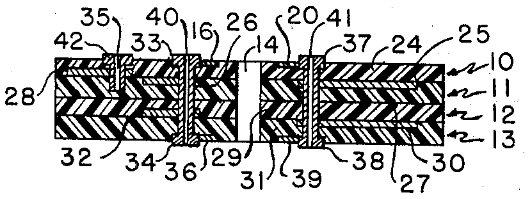

For a better understanding of the invention, together with other and further objects, advantages, and capabilities thereof, reference is made to the following description of the appended drawings, in which:

FIG. 1 is a top plan view of a preferred embodiment of module in accordance with the invention; and FIG. 2 is an elevational sectional view taken along section line 2—2 of FIG. 1, looking in the direction of the arrows.

FIG. 1 shows a module with flush surface contacts designed for a rotating selector switch assembly. FIG. 1 also shows raised plated eyelet-type terminals. The side view (FIG. 2) illustrates the lamination of multiple circuit boards and the provisions for connections to the internal circuitry. Persons skilled in the art will understand that a number of these or similar modules may be tandem ganged in a multi-pole selector assembly.

The embodiment illustrated in FIGS. 1 and 2 is a novel circuit package including a switch. The FIGS. 1–2 embodiment comprises four circuit boards 10, 11, 12, and 13; a journal 14 for a rotary switch arm (not shown); fixed flush copper contacts 16, 17, 18, 19, 20, 21, 22, and 23 on the top face; and other contacts flush on the bottom face. The copper contacts 16–23 are symmetrically arranged in a circle so that the package, including such contacts, provides the stator of a rotary switch. A similar set of contacts is provided on the under face or bottom of the package, those numbered 36 and 39 being shown in FIG. 2. Additionally, the module includes external terminal 42, which is encircuited with printed circuit pattern 28.

The circuit boards comprise the following parts: circuit board 10, B-phase epoxy base 24 and conductive printed circuit patterns 25 and 26 on the bottom: circuit board 11, B-phase epoxy base 27 and conductive printed circuit pattern 28 on the top; circuit board 12, B-phase epoxy base 29 and conductive printed circuit pattern 30 on the bottom; circuit board 13, B-phase epoxy base 31 and conductive printed circuit pattern 32 on the top.

It will be understood that a wide range of switch arrangements is within the scope of the invention.

A suitable rotary switch (not shown) has a conductive arm and is suitably mounted and journaled in aperture 14 to select any desired one of contacts 16–23. Another contact arm (not shown) is suitably ganged with the first-mentioned contact arm for the selection of the desired one of the set of contacts including 36 and 39. That is, selector switch arms are incorporated on both sides of the module such that the module becomes the stator supporting and serving two selectors. The stator provides a journal for switch arms (not shown). It will be understood that an insulated shaft might be used with leaf spring rotor contact arms fastened to it on either side of the module, and these arms would contact the segments sequentially.

It will be noted that connection of circuit pattern 28 to the exterior is provided for by a plated eyelet 42 in edge-contact therewith. In a similar manner contacts 16 and 36 are edge-contact encircuited with portions 33 and 34, respectively, of a plated eyelet which in turn is edge-contact encircuited with conductive circuit patterns 26 and 32, through which it projects. In a similar manner switch contacts 20 and 39 are edge-contact encircuited, respectively, with portions 37 and 38 of a plated eyelet which in turn is edge-contact encircuited with conductive circuit patterns 25 and 30, through which it projects.

The process of making a product in accordance with the invention is now discussed. First the printed boards are placed in a stack. Then, by the application of heat and pressure, the entire module is formed into a cured and encapsulated integral package.

Hole 14 is now drilled. The module is then cleaned. At this stage photo-resist is screened over the entire surface of the module, including surface 14, and the holes to be plated, such as those numbered 35, 40, and 41, are drilled. The drilled holes may be chamfered or countersunk to effect a greater surface to the internal circuitry. This is a refinement and not a requirement. Edge plated connections have proved quite satisfactory. The immersion copper plate or Shipley process is now performed on the module in order to place a Shipley deposit in the holes. The module is now vapor-degreased to remove the Shipley deposit from the outer surfaces while leaving it in the holes. Next the flush switch contacts of the top and bottom boards are masked off, and the module is copper plated. Portions 33, 34, 37, 38, 42 and the like are formed out of the copper top layer by a selective photo-etching process, and all excess copper is removed.

The eyelet portion 37 is in edge contact with contact 20, and this arrangement is representative of the means by which contact is established between each of the flush contacts 20, etc., and whatever conductive circuit pattern is encircuited with a flush contact.

While there has been shown and described what is at present considered to be the preferred embodiment of the invention, it will be understood by those skilled in the art that various modifications and changes may be made therein without departing from the scope of the invention as defined by the appended claim.

I claim:

The method of manufacturing a switch stator with flush surface selector contacts which comprises the sequential steps of:

stacking a top group of symmetrically arranged contacts and a bottom group of symmetrically arranged contacts with a plurality of printed boards each comprising a metallic circuit pattern and a B-stage epoxy base;

applying heat and pressure to compress the stack of circuit boards and contacts until the top and bottom groups of contacts are flush with the bottom and top surfaces of the resultant integral package and to cure said base;

drilling a journal through the geometric centers of the groups of contacts to provide for mounting of a rotor;

applying photo-resist to said package;

drilling holes through said package to provide passages in edge contact with the circuit patterns;

through-plating said passages;

copper-plating said package;

and finally forming terminal portions in contact with the through-plating and the contacts by selective etching of the copper plating.

References Cited by the Examiner

UNITED STATES PATENTS

| | | | |
|---|---|---|---|
| 2,649,513 | 8/53 | Luhn | 200—11 |
| 2,721,822 | 10/55 | Pritikin. | |
| 3,102,213 | 8/63 | Bedson et al. | 174—68.5 |

FOREIGN PATENTS

| | | |
|---|---|---|
| 1,256,632 | 2/61 | France. |

JOHN F. BURNS, *Primary Examiner.*

DARRELL L. CLAY, *Examiner.*